United States Patent
Xue

(10) Patent No.: US 11,502,752 B2
(45) Date of Patent: Nov. 15, 2022

(54) VISIBLE LIGHT COMMUNICATION APPARATUS AND FABRICATING METHOD THEREOF, VISIBLE LIGHT COMMUNICATION SYSTEM

(71) Applicant: BOE TECHNOLOGY GROUP CO., LTD., Beijing (CN)

(72) Inventor: Dapeng Xue, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 245 days.

(21) Appl. No.: 16/769,687

(22) PCT Filed: Dec. 23, 2019

(86) PCT No.: PCT/CN2019/127301
§ 371 (c)(1),
(2) Date: Jun. 4, 2020

(87) PCT Pub. No.: WO2020/155926
PCT Pub. Date: Aug. 6, 2020

(65) Prior Publication Data
US 2021/0226701 A1    Jul. 22, 2021

(30) Foreign Application Priority Data
Jan. 28, 2019  (CN) .......................... 201910078727.4

(51) Int. Cl.
*H04B 10/11*  (2013.01)
*H01L 27/144*  (2006.01)
(Continued)

(52) U.S. Cl.
CPC .......... *H04B 10/11* (2013.01); *H01L 27/1443* (2013.01); *H01L 31/12* (2013.01); *H01L 33/60* (2013.01); *H01L 2933/0066* (2013.01)

(58) Field of Classification Search
CPC ... H04B 10/11; H04B 10/116; H01L 27/1443; H01L 31/12; H01L 33/60; H01L 2933/0066; H01L 33/62; H01L 25/167
See application file for complete search history.

(56) References Cited

U.S. PATENT DOCUMENTS 9,236,942 B1 *  1/2016  Roberds ............... H04B 10/291
9,450,133 B2    9/2016  Nakamura et al.
(Continued)

FOREIGN PATENT DOCUMENTS

CN   101753861 A    6/2010
CN   102592520 A    7/2012
(Continued)

OTHER PUBLICATIONS

"Orthographic projection." Merriam-Webster.com Dictionary, Merriam-Webster, https://www.merriam-webster.com/dictionary/orthographic%20projection. Accessed Mar. 30, 2022.*
(Continued)

*Primary Examiner* — Tanya T Motsinger
(74) *Attorney, Agent, or Firm* — WHDA, LLP

(57) ABSTRACT

The present disclosure related to a visible light communication apparatus, comprising a substrate; a TFT structure layer on the substrate; a photoelectric conversion component on a source or a drain of the TFT structure layer; and a light-emitting component on the substrate. The photoelectric conversion component may be configured to receive an optical signal and convert the optical signal into an electrical signal; and the light-emitting component may be configured to emit an optical signal.

17 Claims, 2 Drawing Sheets

(51) Int. Cl.
*H01L 31/12* (2006.01)
*H01L 33/60* (2010.01)

(56) References Cited

U.S. PATENT DOCUMENTS

| | | | |
|---|---|---|---|
| 11,287,684 B2* | 3/2022 | Cho | G02F 1/133512 |
| 2007/0152249 A1* | 7/2007 | Lim | H01L 27/1462 |
| | | | 257/292 |
| 2008/0030492 A1* | 2/2008 | Lee | G02F 1/1333 |
| | | | 345/207 |
| 2010/0134735 A1 | 6/2010 | Nakamura et al. | |
| 2012/0241769 A1* | 9/2012 | Katoh | G02F 1/13338 |
| | | | 257/458 |
| 2018/0227053 A1* | 8/2018 | Chiang | H04W 4/46 |
| 2018/0278912 A1* | 9/2018 | Yang | G09G 3/003 |
| 2018/0349665 A1* | 12/2018 | He | G01S 15/8915 |
| 2019/0172886 A1* | 6/2019 | Ma | H01L 27/3272 |
| 2019/0210514 A1* | 7/2019 | Baker | B60Q 1/2607 |
| 2019/0215065 A1* | 7/2019 | Fairweather | H04B 5/00 |
| 2020/0028589 A1* | 1/2020 | Li | H04B 10/116 |
| 2020/0042123 A1* | 2/2020 | Kim | G06F 3/0443 |
| 2021/0226701 A1* | 7/2021 | Xue | H04B 10/11 |
| 2021/0257433 A1* | 8/2021 | Bang | H01L 51/5246 |
| 2021/0408168 A1* | 12/2021 | Liang | H01L 27/3232 |
| 2022/0035033 A1* | 2/2022 | Zhao | G01S 17/08 |
| 2022/0035207 A1* | 2/2022 | Meng | G02B 6/0038 |
| 2022/0053263 A1* | 2/2022 | Lin | H04R 3/00 |
| 2022/0101766 A1* | 3/2022 | Yang | G06F 3/0412 |
| 2022/0102198 A1* | 3/2022 | Su | H01L 21/76802 |

FOREIGN PATENT DOCUMENTS

| | | |
|---|---|---|
| CN | 103915466 A | 7/2014 |
| CN | 105551417 A | 5/2016 |
| CN | 107404354 A | 11/2017 |
| CN | 107968679 A | 4/2018 |
| CN | 108964762 A | 12/2018 |
| CN | 109801937 A | 5/2019 |
| KR | 20170044874 A | 4/2017 |

OTHER PUBLICATIONS

International Search Report dated Mar. 24, 2020, issued in counterpart application No. PCT/CN2019/127301 (10 pages).
Office Action dated Jul. 2, 2020, issued in counterpart CN application No. 201910078727.4, with English translation. (19 pages).
Office Action dated Jul. 5, 2021, issued in counterpart CN Application No. 201910078727.4, with English Translation. (33 pages).

* cited by examiner

VISIBLE LIGHT COMMUNICATION APPARATUS AND FABRICATING METHOD THEREOF, VISIBLE LIGHT COMMUNICATION SYSTEM

CROSS-REFERENCE TO RELATED APPLICATIONS

This application claims benefit of the filing date of Chinese Patent Application No. 201910078727.4 filed on Jan. 28, 2019, the disclosure of which is hereby incorporated in its entirety by reference.

TECHNICAL FIELD

The present disclosure relates to the field of visible light communication technologies, and in particular, to a visible light communication apparatus, a fabricating method thereof, and a visible light communication system.

BACKGROUND

The visible light communication technology is an emerging wireless optical communication technology, which uses bright and dark high-speed flashing light signals that are emitted by a light-emitting component such as a fluorescent lamp or a light-emitting diode and invisible to naked eyes to transmit information, and receives and converts light signals into electrical signals through a photoelectric conversion element to realize signal reception and conversion. The visible light communication technology has characteristics of wide application, practical, confidential, high-speed and wide spectrum, which can fill a blind area of current wireless communication, and realize communication anywhere there is a LED lamp.

In order to realize emission and reception of visible light, it is necessary to use a light-emitting component and a photoelectric conversion component to form a system in the prior art. However, because the two components are manufactured using different processes, even if the two components are combined, system integration in the true sense cannot be achieved, thereby resulting in a huge redundancy and complexity of the whole system, which cannot meet the development trend of miniaturization and high efficiency of the system. Furthermore, the visible light communication system composed of the light-emitting component and the photoelectric conversion component in the prior art can only realize one-way communication, the communication direction is not flexible, and the efficiency is low.

BRIEF SUMMARY

One embodiment of the present disclosure is a visible light communication apparatus, comprising a substrate; a TFT structure layer on the substrate; a photoelectric conversion component on a source or a drain of the TFT structure layer; and a light-emitting component on the substrate. The photoelectric conversion component may be configured to receive an optical signal and convert the optical signal into an electrical signal; and the light-emitting component may be configured to emit an optical signal.

Optionally, an orthographic projection of the light-emitting component on the substrate is spaced apart from an orthographic projection of the photoelectric conversion component on the substrate.

Optionally, an optical signal receiving surface of the photoelectric conversion component is oriented to a same direction as a light-emitting surface of the light-emitting component.

Optionally, the optical signal receiving surface of the photoelectric conversion component is in parallel with the light-emitting surface of the light-emitting component.

Optionally, the photoelectric conversion component comprises a photodiode and a transparent conductive layer, the photodiode is on the source or the drain of the TFT structure layer, and the transparent conductive layer is on the photodiode.

Optionally, the visible light communication apparatus further comprises a buffer layer between a gate layer of the TFT structure layer and the substrate.

Optionally, the visible light communication apparatus further comprises a planarization layer overlying the TFT structure layer and the photoelectric conversion component, wherein the light-emitting component is provided with connection electrodes, and the connection electrodes are on the planarization layer.

Optionally, the visible light communication apparatus further comprises a protective layer on the planarization layer, wherein the protective layer wraps around the connection electrodes of the light-emitting component, and exposes connection ends of the connection electrodes of the light-emitting component.

Optionally, the visible light communication apparatus further comprises a reflective layer on the protective layer and surrounding the light-emitting component.

Optionally, the light emitting component is an LED lamp or a micro LED lamp.

One embodiment of the present disclosure is a method for fabricating a visible light communication apparatus, comprising forming a TFT structure layer on a substrate; forming a photoelectric conversion component on a source or a drain of the TFT structure layer; forming a planarization layer on the TFT structure layer and the photoelectric conversion component, and forming a light-emitting component on the planarization layer at a position away from the photoelectric conversion component by a predetermined distance.

Optionally, an orthographic projection of the light-emitting component on the substrate is spaced apart from an orthographic projection of the photoelectric conversion component on the substrate.

Optionally, forming the photoelectric conversion component on the source or the drain of the TFT structure layer comprises forming a photodiode and a transparent conductive layer sequentially on the source or the drain of the TFT structure layer, and patterning the photodiode and the transparent conductive layer.

Optionally, the method for fabricating the visible light communication apparatus, before forming the TFT structure layer, further comprises forming a buffer layer on the substrate, wherein the TFT structure layer is formed on the buffer layer.

Optionally, forming the light-emitting component on the planarization layer comprises forming two connection electrodes of the light-emitting component on the planarization layer, and patterning the connection electrodes; and forming a protective layer on the planarization layer and the two connection electrodes, and forming two connection via holes in the protective layer at positions corresponding to the two connection electrodes.

Optionally, the method for fabricating the visible light communication apparatus, further comprises forming a reflective layer surrounding the two connection via holes on the protective layer.

Optionally, the method for fabricating the visible light communication apparatus further comprises forming a LED lamp on the two connection electrodes by a transfer printing method.

One embodiment of the present disclosure is a visible light communication system, comprising at least two visible light communication apparatuses according to one embodiment of the present disclosure.

Optionally, the at least two visible light communication apparatuses comprise a pair of a first visible light communication apparatus and a second visible light communication apparatus opposite the first visible light communication apparatus, a photoelectric conversion component of the first visible light communication apparatus is configured to receive light emitted from a light-emitting component of the second visible light communication apparatus, and a photoelectric conversion component of the second visible light communication apparatus is configured to receive light emitted from a light-emitting component of the first visible light communication apparatus.

Optionally, the photoelectric conversion component of the first visible light communication apparatus faces the light-emitting component of the second visible light communication apparatus, and the photoelectric conversion component of the second visible light communication apparatus faces the light-emitting component of the first visible light communication apparatus.

BRIEF DESCRIPTION OF THE DRAWINGS

The drawings are used to provide a further understanding of the technical solutions of the present disclosure, and constitute a part of the specification, which together with the embodiments of the present disclosure are used to explain the technical solutions of the present disclosure, and do not constitute a limitation of the technical solutions of the present disclosure.

DETAILED DESCRIPTION

In order to further explain the technical means and efficacy of the present disclosure for achieving the intended purpose of the disclosure, the visible light communication apparatus and the fabricating method thereof, and the visible light communication system according to the present disclosure are specifically implemented below with reference to the accompanying drawings and embodiments. The method, structure, characteristics and efficacy are described in detail later. In the following description, different "one embodiment" or "embodiments" does not necessarily mean the same embodiment. Furthermore, particular features, structures, or characteristics of one or more embodiments can be combined in any suitable form.

Unless otherwise defined, technical terms or scientific terms used in the present disclosure are intended to be in the ordinary meaning of those of ordinary skill in the art. The words "first," "second" and similar words used in the present disclosure do not denote any order, quantity or importance, but are merely used to distinguish different components. The words "including" or "comprising" and the like mean that the element or the item preceding the word includes the element or item listed after the word and its equivalent and do not exclude other components or objects.

Figure 1:
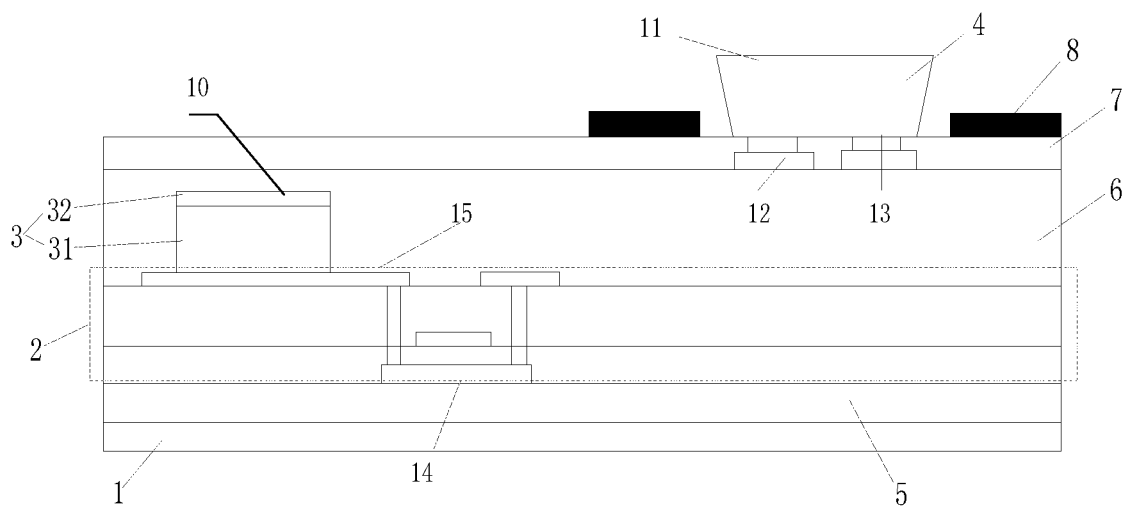
FIG. 1 is a schematic structural diagram of a visible light communication apparatus according to one embodiment of the present disclosure.

One embodiment of the present disclosure provides, as shown in FIG. 1, a visible light communication apparatus, which includes: a substrate 1 and a TFT structure layer 2, a photoelectric conversion component 3, and a light-emitting component 4 integrally integrated on the substrate 1. The photoelectric conversion component 3 is disposed on a source or a drain of the TFT structure layer 2 for receiving an optical signal and converting the received optical signal into an electrical signal. The light-emitting component 4 is configured to emit an optical signal.

In the visible light communication apparatus according to one embodiment of the present disclosure, the substrate 1 may be a rigid substrate or a flexible substrate, such as a glass substrate or a polyimide flexible substrate, which may be selected according to specific use requirements. The specific structure of the TFT structure layer 2 can also be set according to specific needs, that is, the row-column relationship is not specifically limited. The photoelectric conversion component 3 is a component capable of receiving an optical signal and converting the optical signal into an electrical signal, and may use a structure commonly used in the prior art, which may be improved or modified according to specific use requirement. For example, the photoelectric conversion component 3 may be a photodiode. In addition, the photoelectric conversion component 3 can be connected to the source or to the drain of the TFT structure layer 2 when the apparatus is specifically disposed. The specific connection method can be determined according to the specific production process and actual needs. The light-emitting component 4 can be any component capable of emitting light and capable of adjusting the light-emitting frequency. The light-emitting component can be, for example, an LED light-emitting component, a fluorescent lamp, or the like.

In one embodiment, in a specific implementation process, the substrate 1, the TFT structure layer 2, the photoelectric conversion component 3, and the light-emitting component 4 are integrated. That is, the TFT structure layer 2, the photoelectric conversion component 3, and the light-emitting component 4 are required to be fabricated on the substrate 1 by a same or similar process to ensure effective integration. In addition, the light-emitting component 4 and the photoelectric conversion component 3 can be separated by a predetermined distance to avoid interference between the two during operation and facilitate formation of the two on the TFT structure layer.

The visible light communication apparatus provided by one embodiment of the present disclosure has a photoelectric conversion component and a light-emitting component disposed on the substrate, so that the visible light communication apparatus can not only receive the optical signal but also transmit the optical signal, that is, can realize the two-way communication. In addition, the photoelectric conversion component and the light-emitting component are integrally integrated on the substrate. Thus, when the visible light communication apparatus provided by the embodiment of the present disclosure is used for communication in the visible light communication system, the system integration can be achieved in a true sense. Accordingly, the visible light communication system can avoid large redundancy, and the visible light communication system can be miniaturized, flexible, and easy for system control. Such a system can also save space, improve efficiency, and greatly reduce costs.

In one embodiment, as shown in FIG. 1, the optical signal receiving surface 10 of the photoelectric conversion component 3 and the light-emitting surface 11 of the light-emitting component 4 may be parallel or may be angled as long as the visible light communication apparatus provided by the embodiment of the present disclosure can be normally used in the visible light communication system. However, in order to facilitate connection and use of the visible light communication apparatus provided by one embodiment of the present disclosure in the visible light communication system, it is preferable to set the center line of the optical signal receiving surface of the photoelectric conversion component 3 in parallel with the center line of the light emitting surface of the light emitting component 4. That center line of the optical signal receiving surface and the center line of the light-emitting surface are perpendicular to the optical signal receiving surface and the light-emitting surface, respectively. At the same time, the orientation of the receiving surface 10 of the photoelectric conversion component 3 is set in the same direction as the light-emitting surface 11 of the light-emitting component 4. For example, as shown in FIG. 1, both the optical signal receiving surface 10 and the light-emitting surface 11 are oriented or faced in a direction opposite from the substrate. As such, when two visible light communication apparatuses are connected in the visible light communication system, the two apparatuses can be conveniently arranged oppositely. Furthermore, such structural arrangement can effectively prevent the light emitted by the light-emitting component 4 from affecting the optical signal received by the photoelectric conversion component 3 on the same visible light communication apparatus.

In one embodiment, as shown in FIG. 1, the photoelectric conversion component 3 includes a photodiode 31 and a transparent conductive layer 32. The photodiode 31 is disposed on a source or a drain, and the transparent conductive layer 32 is disposed on the photodiode 31.

The photodiode 31 included in the photoelectric conversion component 3 provided by one embodiment of the present disclosure may be of a PIN type, that is, an intrinsic semiconductor layer is formed between the PN junctions. Other structural forms capable of achieving photoelectric conversion may also be used, and the present disclosure is not specifically limited thereto. Since the photodiode 31 operates only after a voltage is applied, the photodiode 31 has the source or the drain of the TFT structure layer 2 as a control electrode and the transparent conductive layer 32 as another control electrode. The transparent conductive layer 32 can be an ITO film. In addition, if the photodiode 31 is connected to the source of the TFT structure layer 2, after the photodiode 31 receives the optical signal and converts the optical signal into an electrical signal, the transmission direction of the electrical signal is from the source to the drain of the TFT structure layer 2. Alternatively, when the photodiode 31 is connected to the drain of the TFT structure layer 2, the transmission direction of the electrical signal is from the drain to the source of the TFT structure layer 2.

As shown in FIG. 1, in one embodiment, the visible light communication apparatus further includes: a buffer layer 5 disposed between the gate layer of the TFT structure layer 2 and the substrate 1.

In one embodiment, since the TFT structure layer 2 can be formed on the substrate 1 layer by layer using a mask process and a heating process is utilized during the formation process, a buffer layer disposed between the substrate 1 and the TFT structure layer 2 can prevent large changes in temperature, thereby reducing the stress caused by temperature changes.

Further, the buffer layer 5 may be made of one or any combination of SiNx, $SiO_2$, SiON. In one embodiment, the buffer layer is preferably a SiNx/$SiO_2$ laminated structure. In one embodiment, the buffer layer 5 preferably has a thickness within a range of about 2000 Å to about 5000 Å.

As shown in FIG. 1, in one embodiment, the visible light communication apparatus further includes: a planarization layer 6 covering the TFT structure layer 2 and the photoelectric conversion component 3. The light-emitting component 4 is provided with connection electrodes, and the connection electrodes 12 of the light-emitting component 4 are disposed on the planarization layer 6.

In one embodiment, the planarization layer 6 can be made of a resin material. By the arrangement of the planarization layer 6, the photoelectric conversion component 3 on the layer where the source and the drain of the TFT structure layer 2 are located is covered, and a flat surface is formed. The flat surface formed by the layer 6 facilitates the placement of the light-emitting component 4. In one embodiment, the thickness of the planarization layer 6 is preferably greater than about 1.5 um.

As shown in FIG. 1, in one embodiment, the visible light communication apparatus further includes: a protective layer 7 disposed on the planarization layer 6. The protective layer wrapped around the connection electrodes 12 of the light-emitting component 4 and exposed the connection ends 13 of the connection electrodes of the light-emitting component 4.

In one embodiment, the protective layer 7 may be made of one or any combination of SiNx, $SiO_2$, SiON, preferably having a thickness within a range of about 1000 Å to about 2000 Å. The protective layer 7 covers the connection electrodes of the light-emitting component 4 and connection via holes are formed in the protective layer 7 at locations corresponding to the connection electrodes. As such, the connection electrodes can be connected to the light-emitting portion of the light-emitting component 4. The protection layer 7 can effectively function as waterproof, anti-corrosion and insulation to further protect the connection electrodes of the light-emitting component 4.

As shown in FIG. 1, in one embodiment, the visible light communication apparatus further includes: a reflective layer 8 disposed on the protective layer 7 and surrounding the light-emitting component 4.

In one embodiment, the arrangement of the reflective layer 8 can prevent the light emitted by the light-emitting component 4 from interfering with the photoelectric conversion component 3 on the same substrate 1 when receiving the optical signals, and improve luminous brightness of the optical signals of the visible light communication apparatus provided by the embodiment of the present disclosure, thereby enhancing transmission performance of optical signals. The material of the reflective layer 8 may not be specifically limited, and may be, for example, a metal material or an organic material. In addition, it should be noted that the reflective layer 8 is only disposed around the light-emitting component 4, and may not block the photoelectric conversion component 3. That is, the reflective layer 8 may not be disposed above the receiving surface of the photoelectric conversion component 3. An orthographic projection of the reflective layer on the protective layer does not overlap an orthographic projection of the receiving surface of the photoelectric conversion component 3 on the protective layer.

In one embodiment, the LED lamp has a long life and a low manufacturing cost, and can be formed integrally with the photoelectric conversion component 3 and the TFT structure layer 2 on the substrate 1 by means of a transfer printing method. Therefore, in one embodiment, the visible light communication apparatus uses an LED lamp as the light-emitting component, and it may be a Micro LED, and may be directly formed by a transfer printing method.

Figure 2:
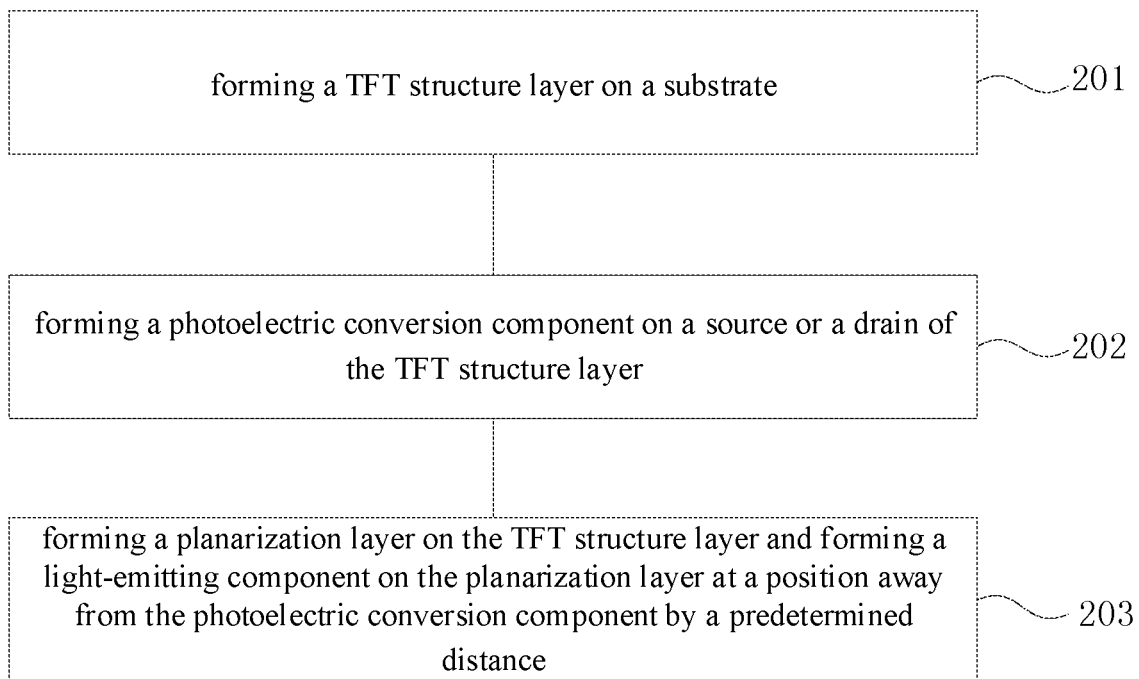
FIG. 2 is a schematic flow chart of a method for fabricating a visible light communication apparatus according to one embodiment of the present disclosure.

As shown in FIG. 2, one embodiment of the present disclosure provides a method for manufacturing a visible light communication apparatus, which is applied to manufacture the visible light communication apparatus provided by one embodiment of the present disclosure. The manufacturing method may include the following steps:

Step 201 includes fabricating a TFT structure layer on a substrate.

In one embodiment, the substrate may be a rigid substrate or a flexible substrate, such as a glass substrate or a polyimide flexible substrate. In one embodiment, before forming the TFT structure layer on the substrate, a buffer layer is formed on the substrate, and then, a TFT structure layer is fabricated on the buffer layer. The buffer layer may be made of one or any combination of SiNx, $SiO_2$, SiON, and the thickness thereof may be within a range of about 2000 Å to 5000 Å. The TFT structure layer may sequentially include an active layer, a gate insulating layer, a gate layer 14, an interlayer insulating layer, and an SD layer 15; wherein the gate insulating layer may be formed using one or any combination of SiNx, $SiO_2$, SiON, and have a thickness within a range of about 1000 Å to about 2000 Å. The gate layer can be patterned according to specific structure needs. The interlayer insulating layer may be made of one or any combination of SiNx, $SiO_2$, SiON, and may have a thickness of about 2000 Å to about 5000 Å, and is patterned by photo, etching, stripping, etc., and via holes of SD may be fabricated. The SD layer may be formed by deposition, and the material thereof may be a metal such as Mo, Al, Ti or a combination thereof. The thickness of the SD layer is preferably greater than about 5000 Å, and patterned by photo, etching, stripping, etc. to form SD electrodes.

Step 202 includes forming a photoelectric conversion component on a source or a drain of the TFT structural layer.

In one embodiment, a photodiode and a transparent conductive layer may be sequentially formed on the source or the drain of the TFT structure layer, and the photodiode and the transparent conductive layer are patterned. That is, the production of the signal receiving terminal is completed.

Step 203 includes forming a planarization layer on the TFT structure layer and the photoelectric conversion component, and fabricating a light-emitting component on the planarization layer at a position of a predetermined distance from the photoelectric conversion component.

In one embodiment, the planarization layer can be made of a resin material, and the thickness thereof is preferably greater than about 1.5 um. In one embodiment, fabricating a light-emitting component on a planarization layer includes: fabricating two connection electrodes of a light-emitting component on a planarization layer, and patterning the connection electrodes; forming a protective layer on the planarization layer and the two connection electrodes; and forming connection via holes in the protective layer at positions corresponding to the two connection electrodes.

The visible light communication apparatus manufactured by the method according to one embodiment of the present disclosure has a photoelectric conversion component and a light-emitting component disposed on the substrate, so that the visible light communication apparatus can not only receive optical signals but also transmit optical signals. That is, it can realize two-way communication. In addition, the photoelectric conversion component and the light-emitting component are integrally integrated on the substrate, so when the visible light communication apparatus provided by one embodiment of the present disclosure is used for communication in the visible light communication system, system integration can be achieved in a true sense. That is, the visible light communication system can avoid large redundancy, and the visible light communication system can be miniaturized, flexible, and easy for system control. Furthermore, such as system can save space, improve efficiency, and greatly reduce costs.

In one embodiment, after the protection layer is completed, in order to prevent the light emitted by the light-emitting component from interfering with the photoelectric conversion component on the same substrate when receiving optical signals, improve illuminating brightness of the optical signals of the visible light communication apparatus provided by one embodiment of the present disclosure, and enhance the transmission performance of the optical signals, a reflective layer can be formed on the protective layer. The reflective layer may surround the two connection via holes. When the protective layer is completed, a LED lamp is formed on the two connection electrodes by a transfer printing method.

Another embodiment of the present disclosure provides a visible light communication system, which includes at least two visible light communication apparatuses according to one embodiment of the present disclosure. As shown in FIG. 1, the visible light communication apparatus includes a substrate 1 and a TFT structure layer 2, a photoelectric conversion component 3, and a light-emitting component 4 integrally integrated on the substrate 1. The photoelectric conversion component 3 is disposed on a source or a drain of the TFT structure layer 2 for receiving optical signals and converting the received optical signals into electrical signals. The light-emitting component 4 is spaced apart from the photoelectric conversion component 3 by a predetermined distance for emitting optical signals. An orthographic projection of the light-emitting component 4 on the substrate is spaced apart from an orthographic projection of the photoelectric conversion component on the substrate. In one embodiment, every two of the visible light communication apparatuses may be disposed opposite each other. In the two oppositely disposed visible light communication apparatuses, the photoelectric conversion component of one visible light communication apparatus faces the light-emitting component of the other visible light communication apparatus, and the light-emitting component of the one visible light communication apparatus faces the photoelectric conversion component of the other visible light communication apparatus, thereby forming a two-way communication channel.

Specifically, the two visible light communication apparatuses disposed oppositely can form a two-way communication channel visible light communication system. Thus, according to the number of two-way communication channels required in a specific use, a plurality of pairs of visible light communication apparatuses can be appropriately configured. That is, the number of the visible light communication apparatuses is set to at least two, and the number needs to be an even number. In one embodiment, the system further includes a client terminal capable of transmitting signals, a signal modulation apparatus at the transmitting terminal, a driving circuit of the light-emitting component, a filtering & amplifying circuit connected to the visible light communication apparatus at the signal receiving terminal, a demodulating apparatus at the receiving terminal, and a client terminal receiving signals.

In addition, in the visible light communication system, the oppositely disposed visible light communication apparatuses are arranged in a relative manner such as facing, diagonally, etc., as long as one visible light communication apparatus is used as the signal transmitting terminal for emitting optical signals, and the other visible light communication apparatus as the signal receiving terminal can normally receive the optical signals. That is, the two can receive each other's optical signals.

The visible light communication apparatus provided by one embodiment of the present disclosure uses a visible light communication apparatus provided with a photoelectric conversion component and a light-emitting component on the substrate, so that the visible light communication apparatus can not only receive the optical signals but also transmit the optical signals. That is, it can realize two-way communication. In addition, the photoelectric conversion component and the light-emitting component are integrally integrated on the substrate, so when the visible light communication apparatus provided by one embodiment of the present disclosure is used for communication in the visible light communication system, the system integration in a true sense can be achieved. The visible light communication system can avoid large redundancy, and the visible light communication system can be miniaturized, flexible, easy for system control. Such a system can save space, improve efficiency, and greatly reduce costs.

The above is only a preferred embodiment of the present disclosure, and is not intended to limit the present disclosure in any way. Any simple modifications, equivalent changes and modifications made to the above embodiments in accordance with the technical spirit of the present disclosure are still in the present disclosure. Within the scope of the inventive solution.

In the case of no conflict, the embodiments of the present disclosure or the features in the embodiments may be combined to obtain a new embodiment.

While the embodiments of the present disclosure have been described above, the described embodiments are merely provided for the purpose of understanding the disclosure and are not intended to limit the disclosure. Any modification and variation in the form and details of the embodiments may be made by those skilled in the art without departing from the spirit and scope of the disclosure. The scope defined by the appended claims shall prevail.

What is claimed is:

1. A visible light communication apparatus, comprising:
a substrate;
a TFT (thin film transistor) structure layer on the substrate;
a photoelectric conversion component on a source or a drain of the TFT structure layer; and
a light-emitting component on the substrate,
wherein the photoelectric conversion component is configured to receive an optical signal and convert the optical signal into an electrical signal; and the light-emitting component is configured to emit an optical signal;
the visible light communication apparatus further comprises a planarization layer overlying the TFT structure layer and the photoelectric conversion component;
the light-emitting component is provided with connection electrodes, and the connection electrodes are on the planarization layer; and
the visible light communication apparatus further comprises a protective layer on the planarization layer, wherein the protective layer wraps around the connection electrodes of the light-emitting component, and exposes connection ends of the connection electrodes of the light-emitting component.

2. The visible light communication apparatus of claim 1, wherein an orthographic projection of the light-emitting component on the substrate is spaced apart from an orthographic projection of the photoelectric conversion component on the substrate.

3. The visible light communication apparatus of claim 1, wherein an optical signal receiving surface of the photoelectric conversion component is oriented to a same direction as a light-emitting surface of the light-emitting component.

4. The visible light communication apparatus of claim 3, wherein the optical signal receiving surface of the photoelectric conversion component is in parallel with the light-emitting surface of the light-emitting component.

5. The visible light communication apparatus of claim 1, wherein the photoelectric conversion component comprises a photodiode and a transparent conductive layer, the photodiode is on the source or the drain of the TFT structure layer, and the transparent conductive layer is on the photodiode.

6. The visible light communication apparatus of claim 1, further comprising a buffer layer between a gate layer of the TFT structure layer and the substrate.

7. The visible light communication apparatus of claim 1, further comprising a reflective layer on the protective layer and surrounding the light-emitting component.

8. The visible light communication apparatus of claim 1, wherein the light emitting component is an LED flight emitting diode) lamp or a micro LED lamp.

9. A visible light communication system, comprising:
at least two visible light communication apparatuses according to claim 1.

10. The visible light communication system of claim 9, wherein the at least two visible light communication apparatuses comprise a pair of a first visible light communication apparatus and a second visible light communication apparatus opposite the first visible light communication apparatus,
a photoelectric conversion component of the first visible light communication apparatus is configured to receive light emitted from a light-emitting component of the second visible light communication apparatus, and a photoelectric conversion component of the second visible light communication apparatus is configured to receive light emitted from a light-emitting component of the first visible light communication apparatus.

11. The visible light communication system of claim 10, wherein the photoelectric conversion component of the first visible light communication apparatus faces the light-emitting component of the second visible light communication apparatus, and the photoelectric conversion component of the second visible light communication apparatus faces the light-emitting component of the first visible light communication apparatus.

12. A method for fabricating a visible light communication apparatus, comprising:
forming a TFT (thin film transistor) structure layer on a substrate;
forming a photoelectric conversion component on a source or a drain of the TFT structure layer;
forming a planarization layer on the TFT structure layer and the photoelectric conversion component, and forming a light-emitting component on the planarization layer at a position away from the photoelectric conversion component by a predetermined distance;

wherein forming the light-emitting component on the planarization layer comprises:

forming two connection electrodes of the light-emitting component on the planarization layer, and patterning the connection electrodes; and forming a protective layer on the planarization layer and the two connection electrodes, and forming two connection via holes in the protective layer at positions corresponding to the two connection electrodes.

13. The method for fabricating the visible light communication apparatus of claim 12, wherein an orthographic projection of the light-emitting component on the substrate is spaced apart from an orthographic projection of the photoelectric conversion component on the substrate.

14. The method for fabricating the visible light communication apparatus of claim 12, wherein forming the photoelectric conversion component on the source or the drain of the TFT structure layer comprises forming a photodiode and a transparent conductive layer sequentially on the source or the drain of the TFT structure layer, and patterning the photodiode and the transparent conductive layer.

15. The method for fabricating the visible light communication apparatus of claim 12, before forming the TFT structure layer, further comprising forming a buffer layer on the substrate, wherein the TFT structure layer is formed on the buffer layer.

16. The method for fabricating the visible light communication apparatus of claim 12, further comprises:

forming a reflective layer surrounding the two connection via holes on the protective layer.

17. The method for fabricating the visible light communication apparatus of claim 16, further comprises:

forming a LED lamp on the two connection electrodes by a transfer printing method.

* * * * *